United States Patent
Yuan

(10) Patent No.: US 6,815,655 B2
(45) Date of Patent: Nov. 9, 2004

(54) METHOD AND APPARATUS FOR SEQUENCING POWER IN A PHOTODETECTOR CIRCUIT

(75) Inventor: Xiaolin Yuan, Davis, CA (US)

(73) Assignee: Intel Corporation, Santa Clara, CA (US)

(*) Notice: Subject to any disclaimer, the term of this patent is extended or adjusted under 35 U.S.C. 154(b) by 562 days.

(21) Appl. No.: 09/962,888

(22) Filed: Sep. 24, 2001

(65) Prior Publication Data

US 2003/0057358 A1 Mar. 27, 2003

(51) Int. Cl.$^7$ ............................................. H01J 40/14
(52) U.S. Cl. ............................. 250/214 R; 250/214 LS
(58) Field of Search ........................ 250/214.1, 214 R, 250/214 A, 214 VT, 214 AL, 214 SW, 208.1, 214 LS; 356/221–222, 226; 327/514

(56) References Cited

U.S. PATENT DOCUMENTS

| | | | |
|---|---|---|---|
| 3,758,796 A | * 9/1973 | Years | ................... 327/514 |
| 4,266,237 A | * 5/1981 | Hendrickson | ................ 257/290 |
| 4,567,363 A | * 1/1986 | Goodnough | ............ 250/214 A |
| 5,886,252 A | 3/1999 | Lennert et al. | |
| 6,359,517 B1 | * 3/2002 | Colaco | ........................ 330/308 |

* cited by examiner

Primary Examiner—David Porta
Assistant Examiner—Patrick J Lee
(74) Attorney, Agent, or Firm—Blakely, Sokoloff, Taylor & Zafman LLP

(57) ABSTRACT

A circuit for use with a photodetector includes multiple switches, a comparator, and a capacitor. The photodetector receives a first voltage and a second voltage at first and second nodes, respectively. The first voltage is higher than the second voltage. The capacitor is connected to the first node. During a power up sequence, the capacitor is charged to the first voltage. The comparator detects when the voltage at the first node reaches a predetermined threshold and in response causes a switch to close so that the second node can receive the second voltage. In a power down sequence, the first and second nodes are allowed to discharge, with the capacitor slowing the discharge of the first node. The comparator detects when the voltage at the first node reaches a predetermined threshold and in response causes another switch to short the second node to ground.

30 Claims, 3 Drawing Sheets

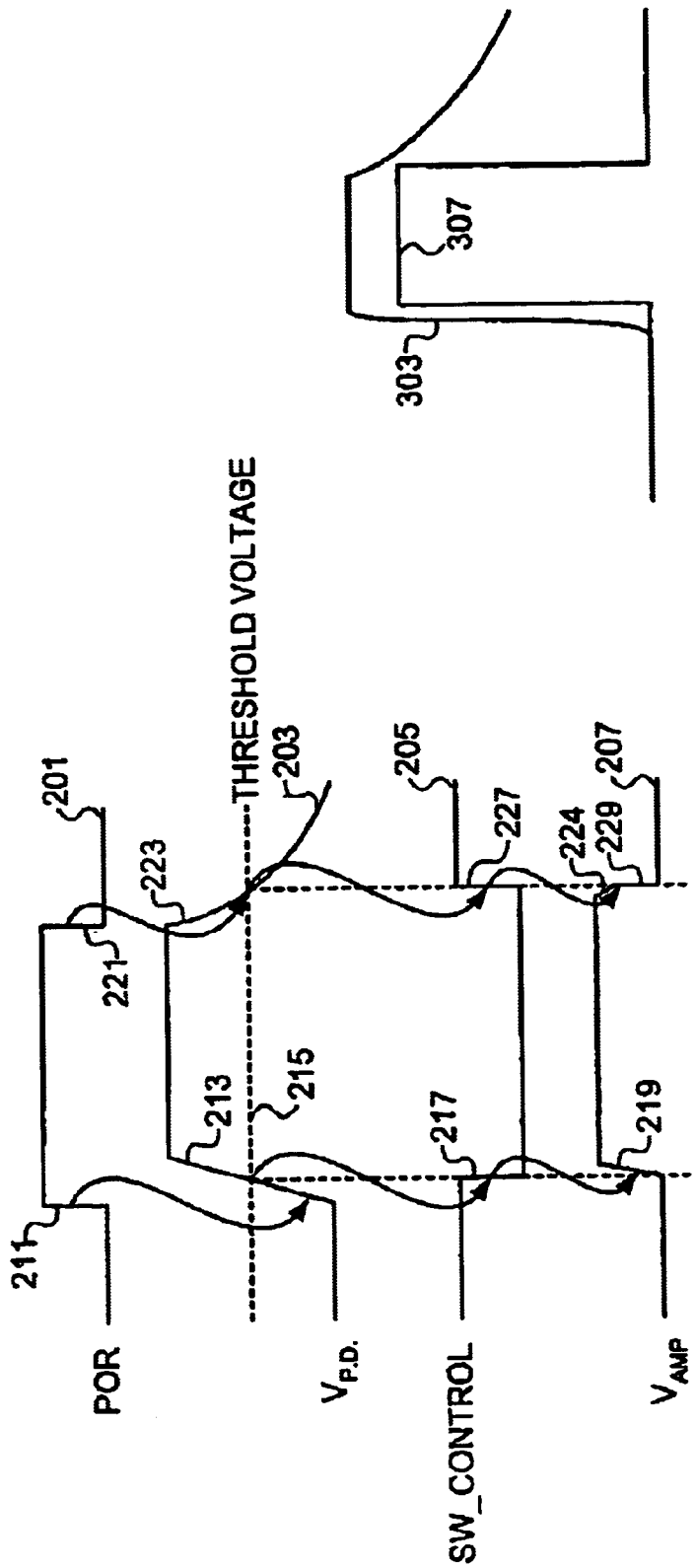

US 6,815,655 B2

METHOD AND APPARATUS FOR SEQUENCING POWER IN A PHOTODETECTOR CIRCUIT

TECHNICAL FIELD

This disclosure relates generally to photodetector circuits, and in particular but not exclusively, relates to power-up and power-down circuits for use with photodetector circuits.

BACKGROUND

Photodetector circuits are widely used in optical receiver applications. One type of photodetector is implemented with a photodiode and a trans-impedance pre-amplifier. In operation, the photodiode is reverse biased, with light causing the photodiode to generate a reverse current that is amplified by the pre-amplifier. The pre-amplifier typically includes a gain resistor that is connected between the input and output leads of the pre-amplifier.

Such photodetector circuits used in fiber optic applications are relatively expensive. In powering these photodetector circuits, care should be taken to prevent forward biasing of the photodiode because the photodiode can be damaged when it conducts relatively large currents.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 2 is a timing diagram illustrating voltages at selected points of the power sequencing circuit of FIG. 1.

FIG. 3 is a diagram illustrating the relative timing of the output voltages of the power sequencing circuit of FIG. 1.

DETAILED DESCRIPTION OF THE ILLUSTRATED EMBODIMENTS

Embodiments of a method and apparatus for sequencing power in a photodetector circuit are described herein. In the following description, numerous specific details are set forth (such as switches, scalers and threshold detectors) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
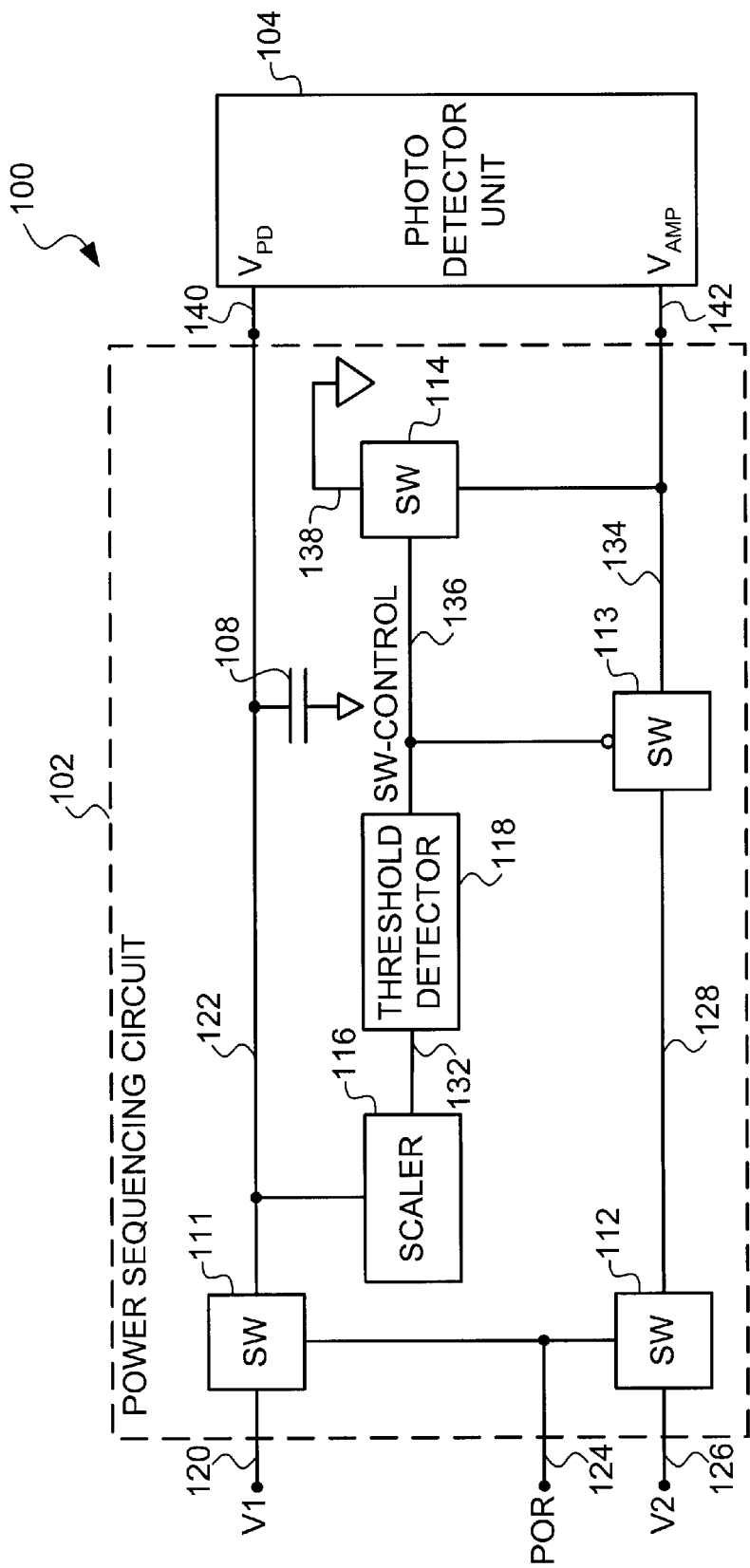
FIG. 1 is a block diagram illustrating a power sequencing circuit according to one embodiment of the present invention.

FIG. 1 illustrates a photodetector system 100, according to one embodiment of the present invention. In this embodiment, photodetector system 100 includes a power sequencing circuit 102 and a photodetector unit 104. In one embodiment, photodetector unit 104 is a commercially available module or integrated circuit die that is separate from power sequencing circuit 102. In other embodiments, power sequencing circuit 102 and photodetector unit 104 may be integrated on the same die. As previously described, photodetector unit 104 includes a photodiode (not shown) that can be damaged if forward biased and a pre-amplifier (not shown) for amplifying the output current of the photodiode. As will be described below, power-sequencing circuit 102 is used to control the voltages provided to power photodetector unit 104.

In addition, power-sequencing circuit 102 includes a capacitor 108, switches 111–114, a voltage scaler 116, and a threshold detector 118. In this embodiment, voltage scaler 116 outputs a voltage having a level that is a scaled version of an input voltage. For example, in one embodiment, voltage scaler 116 is implemented using a standard voltage divider circuit. In other embodiments, scaler 116 may be omitted, depending on how threshold detector 118 is implemented. Threshold detector 118 is configured to detect whether the scaled voltage is greater or less than a preselected voltage level or threshold. However, in other embodiments, threshold detector 118 may have hysteresis.

The elements of power sequencing circuit 102 are interconnected as follows. Switch 111 has first, second and control terminals respectively connected to a line 120 (to receive a voltage V1), a line 122 and a line 124 (to receive a control signal POR). Switch 112 has first, second and control terminals respectively connected to a line 126 (to receive a voltage V2), a line 128, and to line 124. Voltages V1 and V2 are provided by voltage sources (not shown) external to system 100. In one embodiment, voltages V1 and V2 are twelve and eight volts, respectively. In other embodiments, voltages V1 and V2 may be different, depending on the requirements of photodetector unit 104. Voltage V1 is typically higher than voltage V2 so that the photodiode of photodetector unit 104 cannot be forward biased during operation (i.e., the photodiode may be damaged if forward biased).

In this embodiment, switches 111, 112, and 114 are designed so that they are turned on when their control terminals receive logic high level signals. In contrast, in this embodiment, switch 113 is designed to close when its control terminal receives a logic low level signal.

Continuing with the description of the interconnection, threshold detector 118 has an input terminal connected to a line 132 (i.e., the output terminal of scaler 116. Scaler 116 has an input terminal connected to line 122. Switch 113 has first, second and control terminals respectively connected to line 128, a line 134 and to line 136. Threshold detector 118 outputs a signal SW_CONTROL on line 136. Switch 114 has first, second and control terminals respectively connected to line 134, a ground bus, and line 136. Photodetector unit 104 has a terminal 140 connected to line 122 to receive a voltage ($V_{PD}$) for reverse biasing its photodiode (not shown). Photodetector unit 104 also has a terminal 142 connected to line 134 to receive a voltage ($V_{AMP}$) for powering the pre-amplifier (not shown). Power sequencing circuit 102 operates as described below in conjunction with FIG. 2.

FIG. 2 illustrates voltages (not to scale) at selected points of power sequencing circuit 102 (FIG. 1) during operation.

The voltage at line 124 (i.e., signal POR) is represented by a waveform 201. Signal POR is a power-on reset signal generated by a circuit (not shown) external to power sequencing circuit 102, typically when power is applied to the circuit or when a user wants to reset system 100. The voltage at line 122 (i.e., voltage $V_{PD}$) is represented by a waveform 203. The voltage at line 136 (i.e., signal SW_CONTROL) is represented by a waveform 205. The voltage at line 132 (i.e., voltage $V_{AMP}$) is represented by a waveform 207.

Referring to FIGS. 1 and 2, power-sequencing circuit 102 operates as follows. Initially, in this embodiment, waveforms 201, 203 and 207 are at a logic low level with waveform 205 (signal SW_CONTROL) at a logic high level. The logic low level of signal POR turns off (i.e., opens) switches 111 and 112. Thus, the voltage sources providing voltages V1 and V2 are isolated from lines 122 and 128.

When signal POR transitions to a logic high level (as indicated by a rising edge 211 of waveform 201), switches 111 and 112 are turned on (i.e. closed), thereby allowing the voltage sources providing voltages V1 and V2 (also referred to herein as the V1 voltage source and the V2 voltage source) to begin charging lines 122 and 128. The charging of line 122 by the V1 voltage source is represented by a rising edge 213 of waveform 203. In changing line 122, the V1 voltage source also charges capacitor 108. With switch 111 turned on, the voltage at line 122 serves as voltage $V_{PD}$ for photodetector unit 104 (FIG. 1).

As the V1 voltage source charges line 122 to voltage V1, scaler 116 provides a scaled version of the voltage at line 122 (also referred to herein as the scaled voltage) to threshold detector 118. In this embodiment, when the scaled voltage increases to reach the level of the threshold voltage of threshold detector 118 (indicated by a dashed line 215 in FIG. 2), threshold detector 118 outputs signal SW_CONTROL with a logic low level, as represented by a rising edge 217 of waveform 205.

The logic low level of signal SW_CONTROL turns on switch 113, which in turn allows the V2 voltage source to charge line 134 to voltage V2, as represented by a rising edge 219 of waveform 207. With switch 113 turned on, the voltage at line 132 serves as voltage $V_{AMP}$ for photodetector unit 104 (FIG. 1).

The logic high level of signal SW_CONTROL also turns off switch 114, thereby isolating the ground bus from line 134.

The use of threshold detector 118 to wait until voltage $V_{PD}$ reaches a predetermined level advantageously delays the application of voltage $V_{AMP}$ to photodetector unit 104 to ensure that voltage $V_{PD}$ is greater than voltage $V_{AMP}$, which in turn ensures that the photodiode of photodetector unit 104 will not be forward biased during the power up sequence.

A power down sequence begins when signal POR transitions to a logic low level in response to a user turning off the system containing photodetector unit 104 (FIG. 1) or when the external power sources are otherwise disconnected or fail. When signal POR transitions to a logic low level (as indicated by a falling edge 221 of waveform 201), switches 111 and 112 are turned off, thereby isolating the V1 and V2 voltage sources from lines 122 and 128. Thus, lines 122 and 128 begin to discharge, as indicated by falling edges 223 and 224 of waveforms 203 and 207. However, because capacitor 108 has been charged during power-up, the voltage at line 122 drops at a rate slower than that of the voltage at line 134. This feature advantageously helps to ensure that voltage $V_{PD}$ is higher than voltage $V_{AMP}$ during the power down sequence.

When the voltage at line 122 drops to a level that causes the scaled voltage (from scaler 116 in FIG. 1) to reach the level of the threshold voltage (i.e., dashed line 215), then threshold detector 118 transitions signal SW_CONTROL to a logic low level, as represented by a falling edge 227 of waveform 205. This logic low level turns on switch 114 while turning off switch 113. Consequently, switch 113 isolates line 134 from line 128, while switch 114 electrically connects line 134 to the ground bus. Accordingly, the voltage at line 134 quickly drops to zero, as indicated by a portion 229 of the falling edge of waveform 207. This feature advantageously helps to further ensure that voltage $V_{PD}$ remains higher than voltage $V_{AMP}$ during the power down sequence.

FIG. 3 illustrates the relative timing of voltages $V_{PD}$ and $V_{AMP}$ provided by power sequencing circuit 102 (FIG. 1). The level of voltage $V_{PD}$ during a power up and a power down sequence is represented by a waveform 303. Similarly, the level of voltage $V_{AMP}$ is represented by a waveform 307, which is superimposed on waveform 303. As can be seen in FIG. 3, waveform 307 is always below waveform 303 during both power up and power down. Since the anode and cathode of the photodiode of photodetector 104 (FIG. 1) are respectively connected to receive voltage $V_{AMP}$ (waveform 307) and voltage $V_{PD}$ (waveform 303), the photodiode is advantageously not forward biased during both power up and power down.

Figure 4:
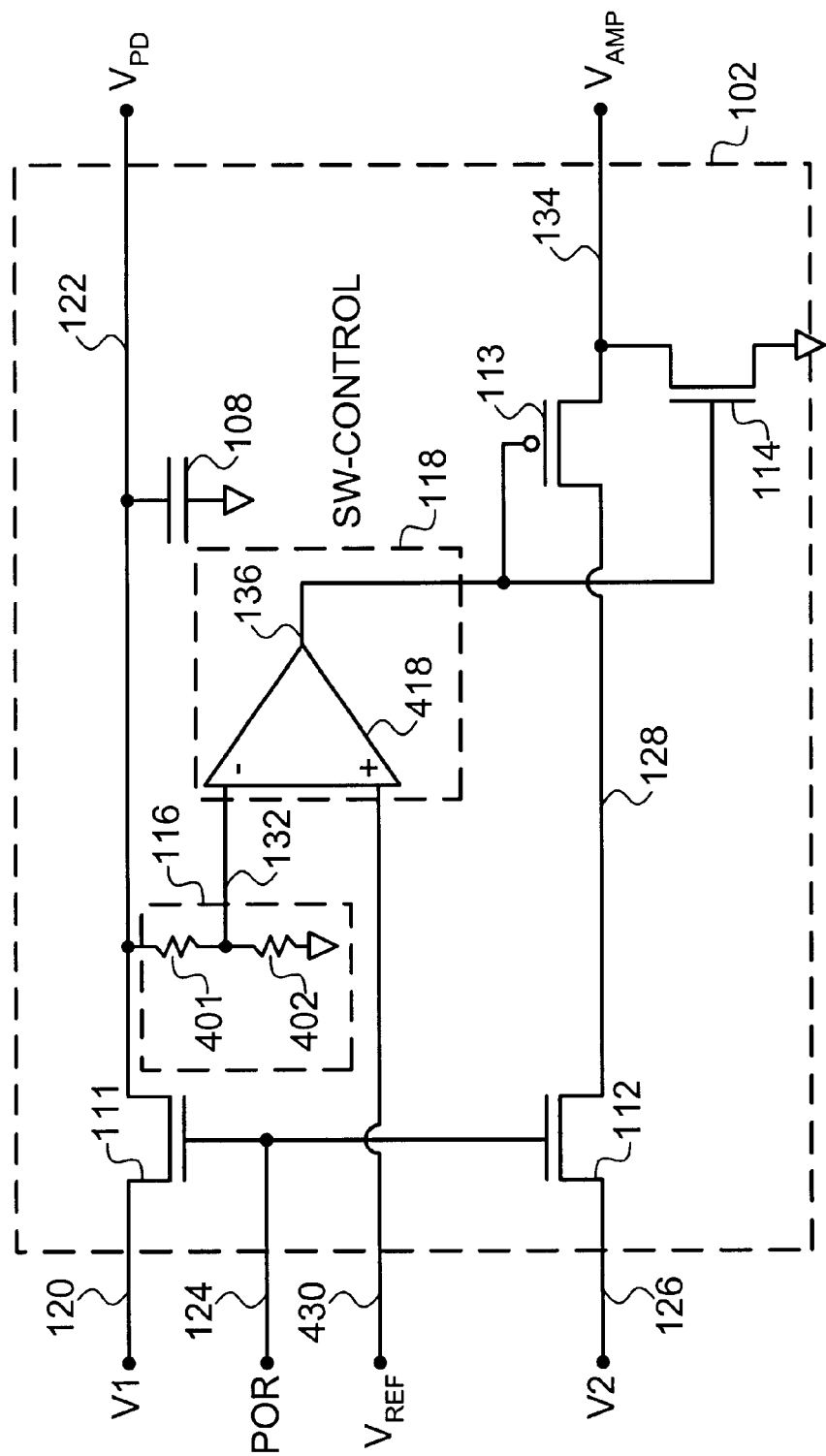
FIG. 4 is a schematic diagram illustrating an implementation of the power sequencing circuit of FIG. 1, according to one embodiment of the present invention.

FIG. 4 is a schematic diagram illustrating an implementation of power sequencing circuit 102 (FIG. 1), according to one embodiment of the present invention. In this embodiment, switches 111, 112 and 114 are implemented using N-channel power MOSFETs (metal oxide semiconductor field effect transistors). Switch 113 is implemented with a P-channel power MOSFET. The term MOSFET is used herein to also include silicon gate technologies. Although MOSFET switches are used in this embodiment, other embodiments may use different types of switching devices such as, for example, bi-polar transistors, relays, standard MOSFETs (as opposed to power MOSFETs), etc.

In addition, in this embodiment, scaler 116 is implemented with a voltage divider. As shown in the embodiment of FIG. 4, resistive elements 401 and 401 are connected in series between line 122 and the ground bus to implement scaler 116. Resistive elements can be any suitable resistive element such as, for example, P-well resistors, MOSFETs biased in the linear or sub-threshold region, etc.

Still further, in this embodiment, threshold detector 118 is implemented with a comparator 418. Comparator 418 compares the scaled voltage with a reference voltage VREF. In one embodiment, the resistances of resistive elements 401 and 402 can be determined as follows. In this exemplary embodiment, signal SW_CONTROL is designed to transition when voltage $V_{AMP}$ is eleven volts. In addition, in this embodiment, a standard 1.24 volt voltage reference is used to provide voltage VREF. Thus, using the voltage divider equation, resistive elements 401 and 402 can have resistances of 88.8 KΩ and 11.2 KΩ (which provides a practical solution to the voltage divider equation).

The capacitance of capacitor 108 can be selected as follows. In this exemplary embodiment, line 22 has a resistance of 10 Ω, and a time constant of 100 ms is desired for the delay. Thus, capacitor 108 has a capacitance of about 10000 μF to achieve this time constant. The capacitance of capacitor 108 can be selected based on the desired time constant and the loading and impedance of line 122 and photodetector unit 104 (FIG. 1).

The elements of this implementation of power sequencing circuit 102 are interconnected as described above in conjunction with FIG. 1, with some additional interconnections for comparator 418 implementing threshold detector 118. More particularly, the gate terminals of the MOSFETS implementing switches 111–114 serve as the control terminals of the switches. Line 132 is connected to the node between resistive elements 401 and 402.

Comparator 418 has its negative terminal connected to line 132, and has its positive terminal connected to a line 430 to receive a reference voltage VREF. In this embodiment, voltage VREF serves as the threshold voltage, and is provided by a voltage source or regulator that is external to power sequencing circuit 102. This embodiment operates as described above, with voltage VREF serving as the threshold voltage.

In an alternative embodiment, threshold detector 118 may be implemented to have hysteresis. For example, threshold detector 118 may be designed so that during a high-to-low transition of signal SW_CONTROL (i.e., a power up sequence), threshold detector 118 will cause signal SW_CONTROL to transition to a logic low level when voltage VPD is at a relatively low level (e.g., 11 volts). Consequently, switch 113 is turned ON after a relatively long delay into the power up sequence; thereby helping to ensure that voltage $V_{PD}$ is greater than voltage $V_{AMP}$ during the power up sequence.

On the other hand, during a low-to-high transition of signal SW_CONTROL (i.e., a power down sequence), threshold detector 118 is designed to cause signal SW_CONTROL to transition to a logic high level when voltage $V_{PD}$ is at a relatively high level (e.g., 11.5 volts). As a result, switch 114 is advantageously turned on a relatively short time into the power down sequence to more quickly discharge line 134, thereby helping to ensure that voltage $V_{PD}$ is greater than voltage $V_{AMP}$ during the power down sequence.

This hysteresis can be implemented in several ways. For example, signal SW_CONTROL may be fed back to a multiplexer (not shown) than selects between two reference voltages to be provided on line 130. In another embodiment, signal SW_CONTROL may be fed back to a switch that connects/disconnects an additional resistive element to line 132 to change the scaling of scaler 116, as a function of signal SW_CONTROL. In yet another embodiment, threshold detector 118 may be replaced with a Schmitt trigger having its input terminal connected to line 132 to receive an appropriately scaled voltage.

In another alternative embodiment, the conductivities of the MOSFETs implementing switches 113 and 114 are reversed, along with the input terminals of threshold detector 118 (i.e., so that the positive input terminal is connected to line 132 and the negative input terminal is connected to line 130). In this way, waveform 205 (FIG. 2) will be inverted, and switches 113 and 114 will still turn on and off with the appropriate timing.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A circuit, comprising:
    a first input terminal coupleable to a first voltage source;
    a second input terminal coupleable to a second voltage source;
    a first output terminal coupleable to a photodetector unit;
    a second output terminal coupleable to the photodetector unit
    a capacitor coupled to the first output terminal;
    a first switch coupled to the first input terminal and to the first output terminal, wherein the first switch to open during a power down sequence;
    a second switch coupled to the second input terminal and the second output terminal;
    a third switch coupled to the output terminal and a supply rail; and
    a threshold detector having an input lead coupled to the first output terminal and an output lead coupled to the second and third switches, wherein the threshold detector to cause second and third switches to open and close, respectively, during the power down sequence as a function of the voltage at the first output terminal.

2. The circuit of claim 1, further comprising a fourth switch, wherein the second input terminal and the second switch are coupled through the fourth switch, the fourth switch to open during the power down sequence.

3. The circuit of claim 1, further comprising a scaler, wherein the first output terminal and the input lead of the threshold detector are coupled through the scaler.

4. The circuit of claim 3, wherein the scaler comprises a voltage divider.

5. The circuit of claim 1, wherein the threshold detector further to cause the second and third switches to close and open, respectively, during a power-up sequence.

6. The circuit of claim 5, wherein the first switch is closed during the power up sequence.

7. The circuit of claim 1, wherein the threshold detector comprises a Schmitt trigger.

8. The circuit of claim 1, wherein the threshold detector comprises a comparator, the comparator having another input lead coupled to receive a reference voltage.

9. The circuit of claim 1, further comprising a feedback circuit coupled to the threshold detector, wherein the feedback circuit to cause the threshold detector to have hysteresis.

10. The circuit of claim 1, wherein the second and third switches each comprise a power metal-oxide-semiconductor field effect transistor (MOSFET).

11. The circuit of claim 10, wherein the power MOSFET of the second switch has a conductivity opposite that of the third switch.

12. A circuit, comprising:
    a first input terminal coupled to a first voltage source;
    a second input terminal coupled to a second voltage source;
    a first output terminal coupleable to a photodetector unit;
    a second output terminal coupleable to the photodetector unit
    a capacitor coupled to the first output terminal;

a first switch coupled to the first input terminal and to the first output terminal;

a second switch coupled to the second input terminal and the second output terminal;

a third switch coupled to the output terminal and a supply rail; and switch control means for causing the second and third switches to open and close, respectively, during a power down sequence as a function of a voltage at the first output terminal.

13. The circuit of claim 12, further comprising a fourth switch, wherein the second input terminal and the second switch are coupled through the fourth switch.

14. The circuit of claim 12, further comprising a scaler coupled to the first output terminal and the switch control means.

15. The circuit of claim 14, wherein the scaler comprises a voltage divider.

16. The circuit of claim 12, wherein the switch control means further for causing the second and third switches to close and open, respectively, during a power-up sequence.

17. The circuit of claim 16, wherein the first switch is opened and closed during the power up and power down sequences, respectively.

18. The circuit of claim 12, wherein the switch control means comprises a Schmitt trigger.

19. The circuit of claim 12, wherein the switch control means further for comparing a reference voltage to a voltage dependent on the voltage provided by the first voltage source.

20. The circuit of claim 12, wherein the switch control means has hysteresis.

21. A method, comprising:

charging a capacitor coupled to a first input terminal of a photodetector unit during a power up sequence;

interrupting a flow of power from a first voltage source providing a first voltage to the first input terminal of a photodetector unit during a power down sequence;

interrupting a flow of power from a second voltage source providing a second voltage to a second input terminal of the photodetector unit during the power down sequence, wherein the second voltage is smaller than the first voltage;

detecting when the capacitor discharges to a predetermined threshold during the power down sequence; and connecting the second input terminal to a ground rail during the power down sequence.

22. The method of claim 21, wherein a comparator is used to detect when the capacitor has discharged to the predetermined threshold.

23. The method of claim 21, wherein detecting when the capacitor has discharged to a predetermined threshold comprises:

providing a scaled voltage that is a function of the voltage of the capacitor; and comparing the scaled voltage with a reference voltage, the reference voltage being a function of the predetermined threshold.

24. The method of claim 23, wherein the scaled voltage is provided by a voltage divider connected to the output terminal.

25. An apparatus, comprising:

a capacitor coupleable to a first input terminal of a photodetector unit;

means for charging the capacitor during a power up sequence of the photodetector unit;

means for interrupting a flow of power from a first voltage source providing a first voltage to the first input terminal of a photodetector unit during a power down sequence of the photodetector unit;

means for interrupting a flow of power from a second voltage source providing a second voltage that is smaller than the first voltage to a second input terminal of the photodetector unit during the power down sequence;

means for detecting when the capacitor has discharged to a predetermined threshold during the power down sequence; and means for connecting the second input terminal to a ground rail during the power down sequence.

26. The apparatus of claim 25, wherein the means for detecting comprises a comparator.

27. The apparatus of claim 25, wherein the means for detecting comprises:

means for providing a scaled voltage that is a function of the voltage of the capacitor; and means for comparing the scaled voltage with a reference voltage, the reference voltage being a function of the predetermined threshold.

28. A system, comprising:

a first input terminal coupleable to a first voltage source;

a second input terminal coupleable to a second voltage source;

a photodetector unit having a first node and a second node;

a capacitor coupled to the first node;

a first switch coupled to the first input terminal and to the first node, the first switch to open during a power down sequence;

a second switch coupled to the second input terminal and the second node;

a third switch coupled to the second node and coupleable to a supply rail; and a threshold detector having an input lead coupled to the first node and having an output lead coupled to the second and third switches, wherein the threshold detector to cause the second and third switches to open and close, respectively, during the power down sequence as a function of a voltage at the first node.

29. The system of claim 28, further comprising a fourth switch, wherein the second input terminal and the second switch are coupled through the fourth switch, the fourth switch to open during the power down sequence.

30. The system of claim 28, further comprising a voltage divider, wherein the first output terminal and the input lead of the comparator are coupled through the voltage divider.

* * * * *

UNITED STATES PATENT AND TRADEMARK OFFICE
CERTIFICATE OF CORRECTION

PATENT NO. : 6,815,655 B2
DATED : November 9, 2004
INVENTOR(S) : Yuan

It is certified that error appears in the above-identified patent and that said Letters Patent is hereby corrected as shown below:

Column 5,
Line 23, delete "VPD" and insert -- $V_{PD}$ --.

Signed and Sealed this

Twenty-sixth Day of July, 2005

JON W. DUDAS
*Director of the United States Patent and Trademark Office*